(12) United States Patent
Köntopp et al.

(10) Patent No.: US 12,261,234 B2
(45) Date of Patent: Mar. 25, 2025

(54) SOLAR CELL MODULE AND METHOD FOR OPERATING A SOLAR CELL MODULE

(71) Applicant: HANWHA Q CELLS GMBH, Bitterfeld-Wolfen (DE)

(72) Inventors: Max Köntopp, Bitterfeld-Wolfen (DE); Uwe Weigelt, Bitterfeld-Wolfen (DE); Thoralf Harder, Bitterfeld-Wolfen (DE); Carsten Baer, Bitterfeld-Wolfen (DE)

(73) Assignee: HANWHA Q CELLS GMBH, Bitterfeld-Wolfen (DE)

( * ) Notice: Subject to any disclaimer, the term of this patent is extended or adjusted under 35 U.S.C. 154(b) by 0 days.

(21) Appl. No.: 17/759,432

(22) PCT Filed: Jan. 26, 2021

(86) PCT No.: PCT/DE2021/100074
§ 371 (c)(1),
(2) Date: Aug. 24, 2022

(87) PCT Pub. No.: WO2021/151430
PCT Pub. Date: Aug. 5, 2021

(65) Prior Publication Data
US 2023/0046616 A1 Feb. 16, 2023

(30) Foreign Application Priority Data
Jan. 27, 2020 (DE) .................. 10 2020 101 809.6

(51) Int. Cl.
*H01L 31/0443* (2014.01)
*H01L 31/02* (2006.01)
*H01L 31/05* (2014.01)

(52) U.S. Cl.
CPC .... *H01L 31/0443* (2014.12); *H01L 31/02021* (2013.01); *H01L 31/0504* (2013.01)

(58) Field of Classification Search
CPC .......... H01L 31/0443; H01L 31/02021; H01L 31/0504
See application file for complete search history.

(56) References Cited

U.S. PATENT DOCUMENTS

| 2014/0265603 A1 | 9/2014 | Augustoni et al. |
| 2015/0171628 A1 | 6/2015 | Ponec et al. |

FOREIGN PATENT DOCUMENTS

CN 109067353 A 12/2018

OTHER PUBLICATIONS

Daliento et al., "A modified bypass circuit for improved hot spot reliability of solar panels subject to partial shading", Solar Energy 134 (2016) 211-218. (Year: 2016).*

(Continued)

*Primary Examiner* — Tae-Sik Kang
(74) *Attorney, Agent, or Firm* — Christensen, Fonder, Dardi & Herbert PLLC; John P. Fonder

(57) ABSTRACT

A solar cell module and a method for operating a solar cell module. The solar cell module includes a plurality of strings which are each formed from a plurality of solar cells connected to one another in a series circuit, wherein each string is connected to a bypass circuit assigned thereto. The solar cell module is also characterized in that the bypass circuit has a switching element and is configured to reduce an electrical current inside the string by switching the switching element when a return current occurs within the associated string.

9 Claims, 2 Drawing Sheets

(56) References Cited

OTHER PUBLICATIONS

Daliento, Santolo, et al., "A modified bypass circuit for improved hot spot reliability of solar panels subject to partial shading," *Solar Energy*, vol. 134, No. 3, pp. 211-218 (May 2016).

Guerriero, Pierluigi, et al., "Toward a Hot Spot Free PV Module," *IEEE Journal of Photovoltaics*, vol. 9, No. 3, pp. 796-802 (May 2019).

* cited by examiner

SOLAR CELL MODULE AND METHOD FOR OPERATING A SOLAR CELL MODULE

RELATED APPLICATIONS

The present application is a National Phase entry of PCT Application No. PCT/DE2021/100074, filed Jan. 26, 2021, which claims priority to German Patent Application No. 10 2020 101 809.6, filed Jan. 27, 2020, the disclosures of which are hereby incorporated by reference herein in their entirety.

FIELD OF THE INVENTION

The invention relates to a solar cell module and to a method for operating a solar cell module.

BACKGROUND OF THE INVENTION

A solar cell module is usually formed from a multiplicity of solar cells connected to one another in a series circuit to form a so-called string. In this case, a plurality of strings interconnected in a parallel circuit or in a series circuit can be arranged in a solar cell module. The strings are arranged on a carrier and laminated with a back side film (so-called glass-film module) or arranged between two glass layers (so-called glass-glass module). The laminate thus produced is usually held in a metallic carrier frame. A junction box secured directly to the laminate or to the carrier frame serves to receive the line ends of the string(s) and to allow external connection to the solar cell module.

A serious problem during the operation of a solar module is shading or partial shading: if solar cells of a string are in shade, then this has adverse effects on the generation of electricity in the entire string. The shaded or partially shaded solar cell(s) in the string act(s) as ohmic resistance and may heat up locally, with so-called hot spots being formed. In order to counteract this effect, the solar cells of a solar cell module are usually interconnected to form a plurality of strings, and a bypass diode or freewheeling diode is connected in parallel with each string. During normal operation, the bypass diode is reverse-biased. If shading or partial shading occurs within a string, or a defect results in the string not supplying any current, then the bypass diode switches to the forward state and conducts the current of the other strings past the partially shaded or defective string. This situation is referred to as a back current case.

As the module power increases, ever higher temperatures of the shaded solar cell(s) are attained in the back current case, irrespective of how susceptible to the formation of hot spots the solar cell(s) is/are. As a result, critical temperatures that may lead to damage to the laminate and in particular the back side film are attained in the solar cell module. This also applies to the case where the laminate is formed from strings arranged between two glass layers. Furthermore, glass fracture, loss of the soldered joint or chemical decomposition may occur on account of the high temperatures.

SUMMARY

It is an object of the invention to provide a solar cell module and a method for operating a solar cell module so as to allow safe and efficient operation in the case of shading or partial shading even with relatively high module powers.

The object is achieved according to the invention by means of a solar cell module having the features as described herein and by means of a method for operating a solar cell module having the features described herein. Advantageous developments of the invention are also presented herein.

The invention is based on the consideration, in the case of a back current, i.e. if a solar cell in the string is shaded or partially shaded, of interrupting or at least reducing the current within the string, with the result that excessive heating up of the shaded or partially shaded solar cell is avoided. This can also be taken to mean, in particular, that a reduction and/or interruption occur(s) intermittently or that a time average of the current within the string is reduced. For this purpose, the string is connected to a bypass circuit having a switching element. In accordance with a further aspect of the invention, a method is additionally provided in which, upon the occurrence of a back current within the associated string, an electric current within the string is reduced by means of switching of the switching element.

Depending on how completely the switching element is switched, the current in the string is reduced to a greater or lesser extent. Ideally, the switching element would be able to substantially completely disconnect the string at least intermittently. Preferably, a current reduction of at least 30%, 50%, 60%, 70% or 90% takes place. These percentages may relate to a time average value, in particular. Alternatively or additionally, the percentage current reduction may relate to an instantaneous value or a peak value of the current profile.

Since the current flow within a string is in part greatly reduced in the case of shading or partial shading, strings of practically any desired length can be formed, for example each comprising more than 30, 40 or 50 solar cells. Consequently, it would also be possible to construct a solar cell module having a rated power of more than 500 W, preferably more than 600 W or 700 W, even if the solar cell module has only three strings. This would have the advantage that it would still only be necessary to install three bypass diodes in the solar cell module, as is customary for present-day modules.

Expediently, the switching element is connected to the solar cells of the associated string in a series circuit. That means that the switching element or the switching part of the switching element is electrically connected in series with the solar cells of the string.

In one preferred embodiment, provision is made for the switching element to be an active switching element, i.e. to comprise at least one active electronic component. Expediently, the active switching element is a transistor, in particular a field effect transistor. For example, this can involve a so-called metal oxide semiconductor field effect transistor or MOSFET. In particular, a power switching element should be used here, for example a power MOS.

In one advantageous development, provision is made for the bypass circuit to have a bypass diode connected to the associated string in a parallel circuit. Alternatively, the bypass diode can be replaced by some other component that recognizes a back current situation.

In accordance with one preferred development, provision is made for the bypass circuit to have a control circuit designed, upon the occurrence of the back current within the associated string, to reduce the electric current within the string by means of controlling the switching element. The switching element can for example reduce the current in the string just for a predefined time period or disconnect the string for a predefined time period. The switching element can be closed again after this time period. If the shading situation has ended in the meantime, then the string will once again contribute completely to the generation of electricity.

Otherwise, i.e. if the shading situation has not ended in the meantime, the switching element, with the control circuit being embodied accordingly, can be switched again in order to limit the current in the string. In this case, the control circuit would be designed to cyclically reduce the electric current within the string by means of controlling the switching element. The circuit would then pulsate cyclically. Other embodiments of the control circuit are possible in order to cyclically reduce the electric current within the string by means of controlling the switching element. By way of example, the control circuit could be designed to switch the switching element for a predefined time period.

Provision is preferably made for the control circuit to have a comparator circuit and/or an inverter circuit.

The comparator circuit, also simply called comparator, is provided in particular for comparing a voltage drop across the string with a predefined voltage and for generating a control signal as a result. The predefined voltage can be provided in the form of a component with a threshold voltage. By way of example, a Zener diode with a predefined Zener voltage can be used. The comparator preferably has an operational amplifier that carries out the comparison. Preferably, the control circuit is dimensioned in such a way that an operational amplifier that does not have a rail-to-rail output can be used.

The control signal generated by the comparator can be transmitted to the inverter circuit, also called inverter for short, in order to obtain an inverted control signal at the output of the control circuit. The inverter can be a CMOS inverter, in particular, which thus has pairwise complementary metal oxide semiconductor field effect transistors (MOSFETs).

Advantageously, the control circuit obtains its supply voltage from the string itself. This at least occurs preferably in the case of the comparator and/or the inverter, if the latter are provided. In particular, a backup capacitor can be provided for this purpose and maintains the operating voltage for the control circuit or parts thereof in the case of a voltage drop.

Preferably, the strings are arranged in a laminate, which can be formed from a glass layer and a film layer, in particular a back side film, or from two glass layers. In one preferred embodiment, provision is made for the bypass circuit to be accommodated in a junction box (also referred to as J-box) of the solar cell module. Expediently, the junction box can be arranged directly on the laminate. In particular embodiments, two or more junction boxes can be provided for a solar cell module.

BRIEF DESCRIPTION OF THE DRAWINGS

The invention is explained below on the basis of exemplary embodiments with reference to the figures. Here in each case in a circuit diagram.

DETAILED DESCRIPTION

Figure 1:
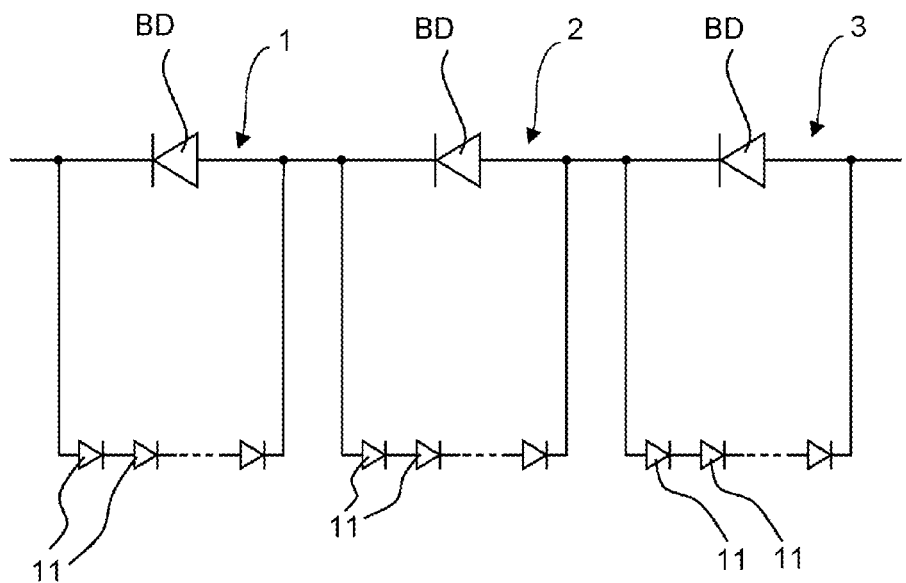
FIG. 1 shows a circuit of a solar cell module comprising three strings having parallel-connected bypass diodes in accordance with the prior art.

A schematic circuit diagram of a solar cell module having a multiplicity of solar cells 11 in accordance with the prior art is shown in FIG. 1. The solar cells 11 are interconnected to form three strings 1, 2, 3 consisting in each case of a plurality of solar cells 11 connected to one another in a series circuit. Each string 1, 2, 3 is connected to a bypass diode BD in a parallel circuit. If one or more solar cell(s) 11 in a string 1 is/are partially or completely shaded, then the (partially) shaded solar cell 11 becomes a consumer and the current direction in the string reverses (back current case). In this case, the bypass diode BD assigned to the string 1 is turned on and conducts the current of the solar cell module past the associated string 1. At the same time, however, the current generated in the non-shaded solar cells 11 of the affected string 1 is consumed in the (partially) shaded solar cell 11, which, after all, now acts as a consumer. Depending on the length of the string 1, on account of this the (partially) shaded solar cell 11 may heat up and thus lead to damage to the solar cell 11 or the encapsulation or lamination of the solar cell module. A similar problem arises if a solar cell 11 no longer generates current or sufficient current on account of a defect, instead of as a result of shading.

Figure 2:
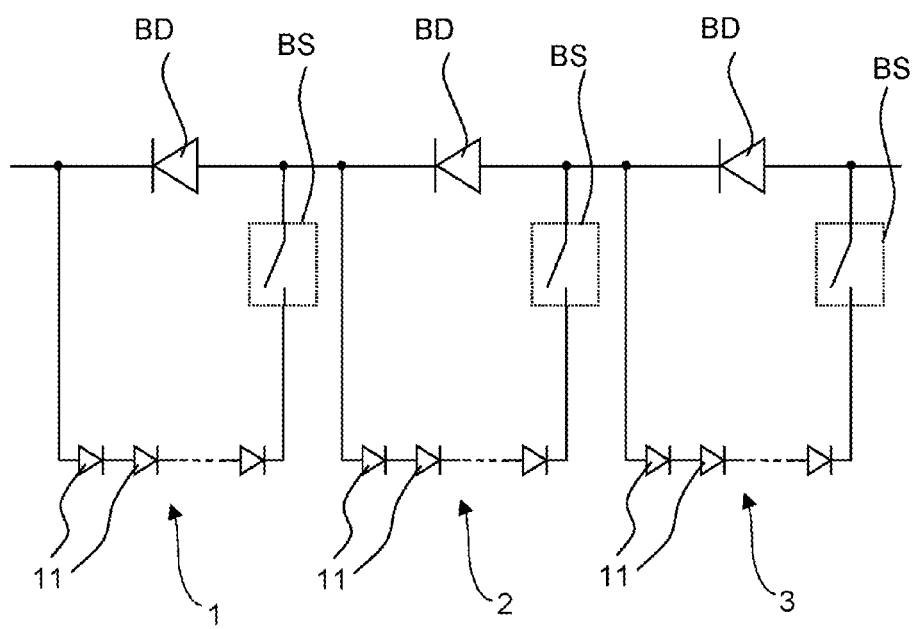
FIG. 2 shows a circuit of a solar cell module comprising three strings in accordance with one preferred embodiment with a bypass circuit provided per string in addition to the bypass diode.

The solution to this problem, according to the invention, is illustrated schematically in FIG. 2. Here, in addition to the bypass diode BD, a respective bypass circuit BS is added to each string 1. The bypass circuit BS has a switching element, which, upon the determination of a back current case within the associated string 1, leads to a disconnection of the string 1 from the rest of the solar cell module. For this purpose, the switching element in the associated string 1 is connected to the solar cells 11 in a series circuit. In FIG. 2, the bypass circuit BS is illustrated as an element separate from the bypass diode BD. However, the bypass diode BD may also be regarded as part of the bypass circuit BS. In actual fact, the bypass circuit BS is preferably additionally arranged in parallel with the bypass diode BD since it can detect the back current case for example by means of monitoring the voltage drop across the bypass diode BD. This is evident from the subsequent FIG. 3, which shows a preferred embodiment of the bypass circuit BS in which a voltage drop across the bypass diode BD is detected.

Figure 3:
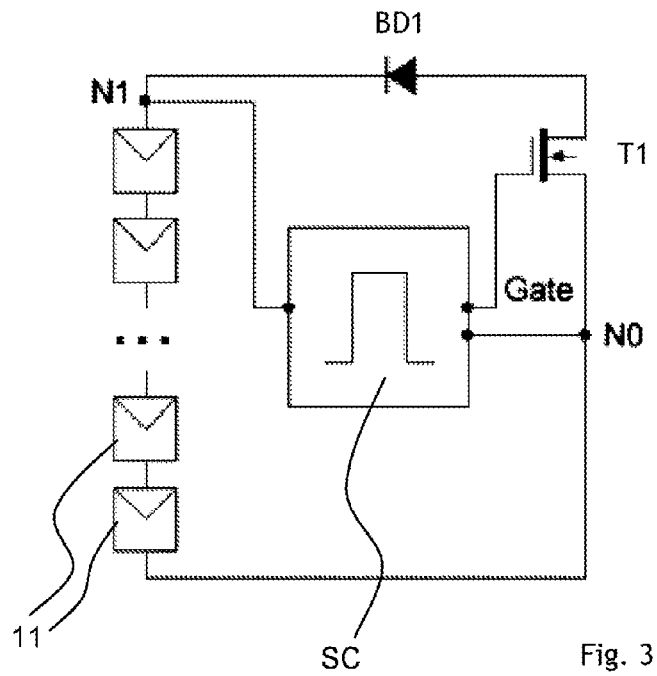
FIG. 3 shows a string with a bypass circuit in accordance with one preferred embodiment with a switching element and a control circuit.

A preferred embodiment of a string 1 comprising a plurality of interconnected solar cells 11 with a bypass circuit is illustrated in FIG. 3. A field effect transistor T1 is used here as switching element T1. In the normal case, i.e. when none of the solar cells 11 in the string is shaded, the rated voltage of, for example, 12 V relative to a first node N0 is present downstream of the bypass diode BD at a marked second node N1. In the bypass case or back current case, i.e. when the bypass diode BD is turned on, the voltage at the second node N1 decreases. The voltage at the second node N1 will ideally decrease to 0 V. In practice, however, it is also possible for the voltage at the node N1 to decrease to only approximately 3-4 V in the back current case, i.e. to approximately one quarter or third of the rated voltage.

In order that the switching element T1 is controlled correctly in the case of different voltage value reactions in the back current case, a control circuit SC is provided. The control circuit is arranged between the two nodes N1 and N0 and generates a voltage as output signal Gate, which voltage controls the switching element T1. In the present case, the switching element T1 is a field effect transistor T1, the gate output of which receives the output signal Gate of the control circuit SC.

Figure 4:
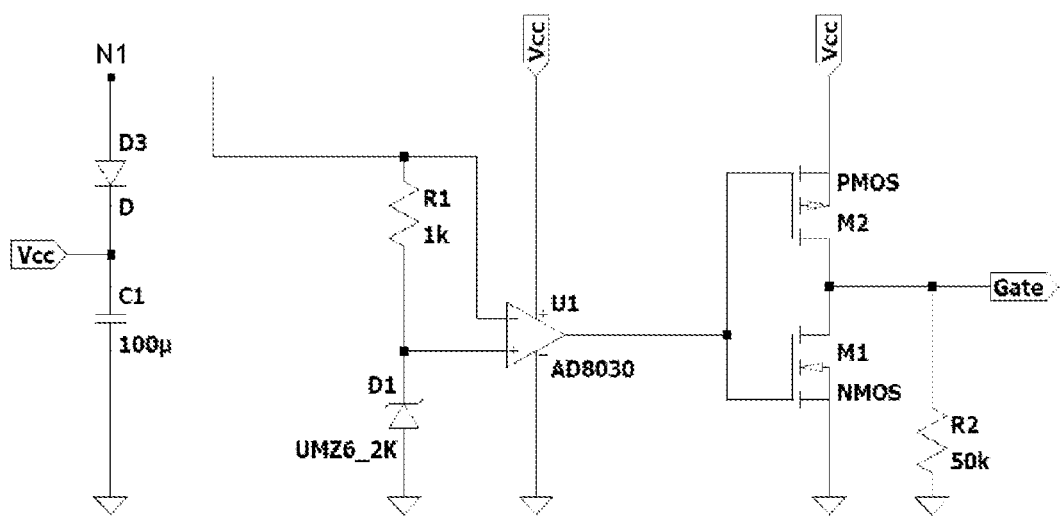
FIG. 4 shows a control circuit for controlling the switching element in accordance with one preferred embodiment.

A circuit diagram of a preferred embodiment of the control circuit SC is represented in FIG. 4. The control circuit SC comprises a voltage supply section formed from a diode D3 and a backup capacitor C3, a comparator formed from a first resistor R1, a Zener diode D1 and an operational amplifier U1, and also an inverter comprising two complementary MOSFETs, namely an N-type MOS or NMOS M1 and a P-type MOS or PMOS M2. Consequently, a CMOS inverter is involved here.

The grounding node of the control circuit SC is connected to the first node N0 shown in FIG. 3. The second node N1 is connected to the anode of the diode D3. The string voltage present between the two nodes N0 and N1 is thus present across the series circuit comprising diode D3 and backup capacitor C1. During operation, for example 12 V can be present between the nodes N0 and N1. On account of this, the backup capacitor C1 is charged via the diode D3. The diode D3 prevents the backup capacitor C1 from draining into the string upon the collapse of the supply voltage.

The supply voltage for the downstream comparator and for the inverter is tapped off ahead of the diode D3. This is illustrated in the diagram in FIG. 4 by the tap marked Vcc, which taps off the voltage on the cathode side at the diode D3 and feeds it to the comparator and to the inverter. The size of the backup capacitor C1 has to be optimized experimentally. In the present embodiment, a capacitor having a capacitance of 100 µF was chosen.

The Zener diode D1 here has a Zener voltage of 6.2 V. During normal operation, from the operating voltage present, 6.2 V, i.e. the Zener voltage, is dropped across the Zener diode D1. The remaining 5.8 V is dropped across the resistor R1. Consequently, 5.8 V more is present at the inverting input of the operational amplifier U1 compared with the positive input, such that the operational amplifier U1 toggles in the direction of negative operating voltage (here 0 V). Even without the use of an operational amplifier with a rail-to-rail output, significantly less than 1 V is thus present at the output of the operational amplifier. The downstream CMOS inverter interprets this voltage as a low level and pulls the output Gate in the direction of the operating voltage. The switching element T1 is turned on and conducts the string current.

If a solar cell 11 is then shaded in the string, it becomes a consumer and part of the string voltage is dropped across it. As a result, the voltage at the second node N1 decreases. As soon as the voltage at the second node N1 falls below the Zener voltage of the Zener diode D1 (here 6.2 V), current can no longer flow via the Zener diode D1. Consequently, voltage is no longer dropped across the resistor R1 either. The voltage at both inputs of the operational amplifier U1 is then equal. A voltage which is greater than half the operating voltage of the operational amplifier U1 is thus established at the output of the operational amplifier U1. This means a high level for the downstream inverter, which leads to a low level at the output of the inverter, said low level being between 0 and 1 V in this embodiment. This voltage is lower than the threshold voltage of the field effect transistor T1. Consequently, the field effect transistor T1 is turned off and current no longer flows in the string. As a result, however, voltage is then no longer dropped across the shaded solar cell, and so the voltage rises again abruptly at the second node N1. The system therefore toggles again in the other direction and the field effect transistor T1 is turned on again. The cycle begins anew; the system pulsates.

Since, immediately after the string has been switched off, the full voltage is available again for the supply of the control circuit SC and for charging the backup capacitor C1, the capacitance of the backup capacitor C1 can preferably be chosen to be significantly less than 100µ.

The output resistor R2 serves to cleanly terminate the output potential from output signal Gate. The output resistor R2 should be chosen with the highest possible resistance in order not to consume current unnecessarily. The same applies to the resistor R1 in the comparator.

LIST OF REFERENCE SIGNS 1, 2, 3 String
11 Solar cell
BD Bypass diode
BS Bypass circuit
T1 Field effect transistor, switching element
R1 Resistor
R2 Output resistor
D1 Zener diode
D3 Diode
M1 NMOS field effect transistor
M2 PMOS field effect transistor
C1 Backup capacitor
U1 Operational amplifier
N0 First node
N1 Second node

The invention claimed is:

1. A solar cell module, comprising:
a plurality of strings formed in each case from a plurality of solar cells connected to one another in a series circuit,
wherein each string is connected to a bypass circuit assigned thereto, and the bypass circuit has a switching element and is configured, upon an occurrence of a back current within an associated string, to reduce an electric current within the associated string by switching of the switching element,
wherein the bypass circuit has a control circuit configured to:
cyclically reduce the electric current within the associated string by controlling the switching element,
upon the occurrence of the back current within the associated string due to a shading situation, to reduce the electric current within the associated string by controlling the switching element for a predefined time period, and
after the predefined time period, and when the shading situation persists, to switch the switching element again in order to limit the electric current in the associated string to cyclically reduce the electric current within the associated string by controlling the switching element.

2. The solar cell module as claimed in claim 1, wherein the switching element is connected to the solar cells of the associated string in a series circuit.

3. The solar cell module as claimed in claim 1, wherein the switching element is an active switching element.

4. The solar cell module as claimed in claim 3, wherein the active switching element is a transistor.

5. The solar cell module as claimed in claim 4, wherein the active switching element is a field effect transistor.

6. The solar cell module as claimed in claim 1, wherein the bypass circuit has a bypass diode connected to the associated string in a parallel circuit.

7. The solar cell module as claimed in claim 1, wherein the control circuit has a comparator circuit and/or an inverter circuit.

8. The solar cell module as claimed in claim 1, wherein at least one junction box in which the bypass circuit and/or the control circuit are/is accommodated.

9. A method for operating a solar cell module comprising a plurality of strings formed in each case from a plurality of solar cells connected to one another in a series circuit, wherein each string is connected to a bypass circuit assigned thereto and having a switching element, and a control circuit, wherein the method has a step, upon an occurrence of a back current within an associated string due to a shading situation, of reducing an electric current within the associated string by controlling the switching element and switching of the switching element for a predefined time period, and after the predefined time period, and when the shading situation persists, to switch the switching element again in order to limit the electric current in the associated string to cyclically reduce the electric current within the associated string by controlling the switching element.

\* \* \* \* \*